(12) United States Patent
Sheen

(10) Patent No.: US 8,378,743 B2
(45) Date of Patent: Feb. 19, 2013

(54) REDUCING PULSE ERROR DISTORTION

(75) Inventor: Timothy Sheen, Brighton, MA (US)

(73) Assignee: Bose Corporation, Framingham, MA (US)

( * ) Notice: Subject to any disclaimer, the term of this patent is extended or adjusted under 35 U.S.C. 154(b) by 230 days.

(21) Appl. No.: 12/717,224

(22) Filed: Mar. 4, 2010

(65) Prior Publication Data

US 2011/0215867 A1    Sep. 8, 2011

(51) Int. Cl.
    *H03F 3/38* (2006.01)
(52) U.S. Cl. .......................................... 330/10; 330/251
(58) Field of Classification Search .................... 330/10, 330/251, 207 A
    See application file for complete search history.

(56) References Cited

U.S. PATENT DOCUMENTS

| 7,541,869 | B2 * | 6/2009 | Adduci et al. | 330/251 |
| 2002/0167354 | A1 | 11/2002 | Stanley | |
| 2007/0229155 | A1 * | 10/2007 | Adduci et al. | 330/251 |
| 2009/0115510 | A1 * | 5/2009 | Tamisier | 330/10 |

FOREIGN PATENT DOCUMENTS

WO    0022727 A1    4/2000

OTHER PUBLICATIONS

International Preliminary Report on Patentability dated Sep. 4, 2012 for International Application No. PCT/US2011/026013.
International Search Report and Written Opinion dated Jun. 22, 2011 for PCT/US2011/026013.

* cited by examiner

*Primary Examiner* — Henry Choe

(57) ABSTRACT

A class D amplifier that includes circuitry to apply a non-linear correction to pulse error distortion. The amplifier includes an output voltage controlling circuit, comprising at least two switches, controlled by a modulator; an output inductor, coupling the switching circuit to an output terminal; and correction circuitry to provide to the modulator a correction signal characterized by a non-linearity. The correction circuitry includes a current sensor that senses the current from the output inductor to the output terminal.

6 Claims, 3 Drawing Sheets

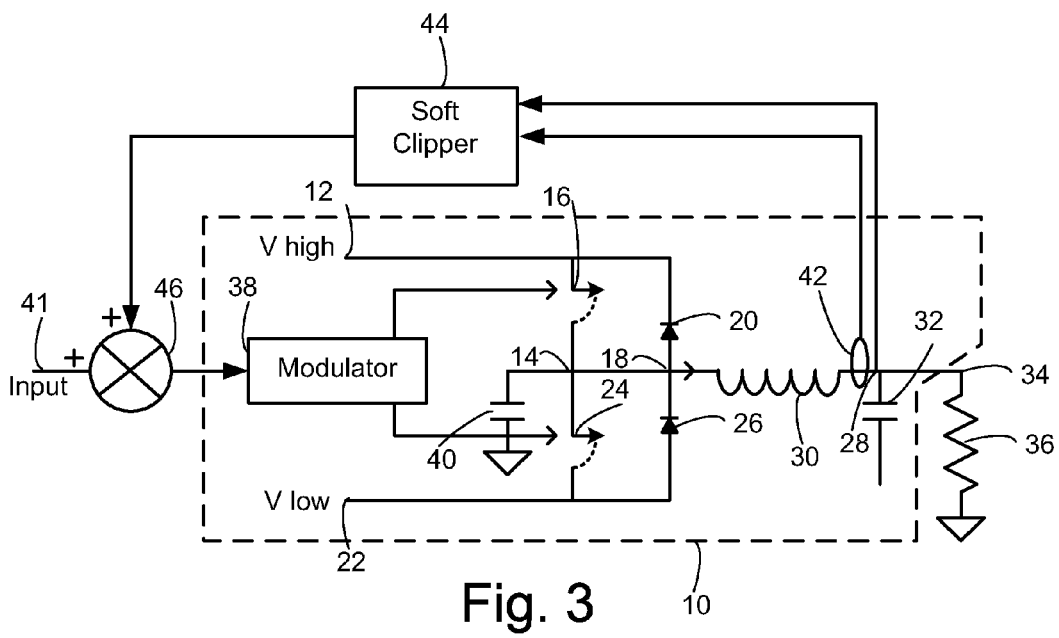
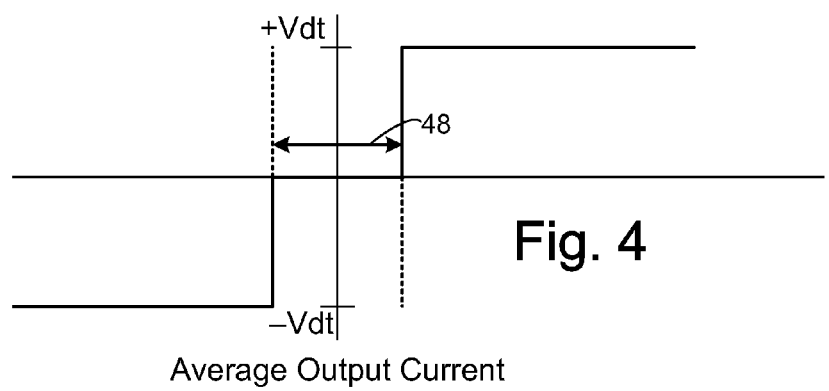
Fig. 3
Fig. 4
Average Output Current

Average Output Current

US 8,378,743 B2

REDUCING PULSE ERROR DISTORTION

BACKGROUND

This specification describes a method and apparatus for correcting pulse error distortion in class D amplifiers.

SUMMARY

In one aspect, an amplifier includes an output voltage controlling circuit, comprising at least two switches, controlled by a modulator; an output inductor, coupling the switching circuit to an output terminal; and correction circuitry to provide to the modulator a correction signal characterized by a non-linearity, comprising a current sensor that senses the current from the output inductor to the output terminal. The correction circuitry may further include a voltage sensor at the output terminal, coupled to the correction circuitry. The sensed voltage may modifies the correction signal by modifying the shape of the non-linearity. The switching circuit may be is characterized by a duty cycle, and the correction signal may modify the duty cycle. The correction circuitry may include a soft clipper to provide the correction signal.

In another aspect, a method for operating an amplifier includes opening and closing a plurality of switches according to a duty cycle to control the voltage provide to an output terminal; measuring current through an inductor to the output terminal; sensing the current through the inductor to the output terminal to provide a sensed current measurement; and based on the sensed current measurement, applying a non-linear correction signal to the duty cycle. The non-linear correction signal may be responsive to the voltage at the output terminal.

Other features, objects, and advantages will become apparent from the following detailed description, when read in connection with the following drawing, in which:

BRIEF DESCRIPTION OF THE SEVERAL VIEWS OF THE DRAWING

FIGS. 1-3 are block diagrams of class D amplifiers;

FIGS. 4 and 6 are plots of output voltage as a function of the average output current.

DETAILED DESCRIPTION

Figure 1:
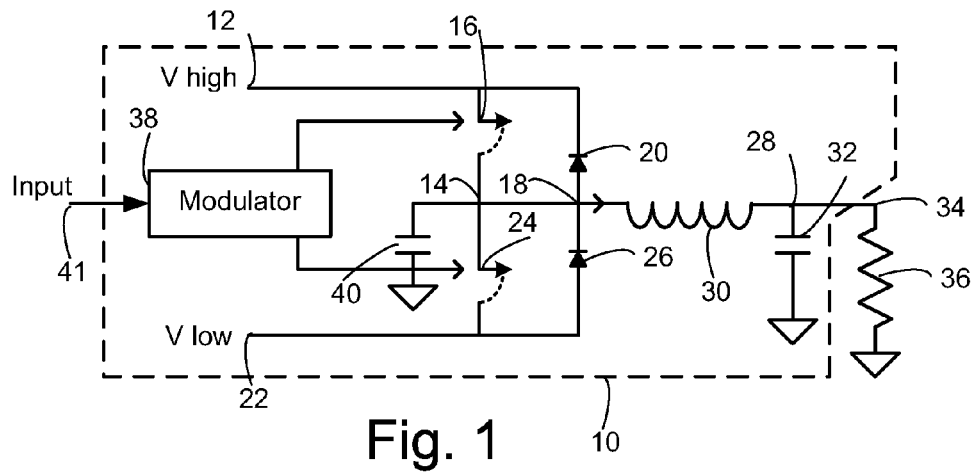

Though the elements of several views of the drawing may be shown and described as discrete elements in a block diagram and may be referred to as "circuitry", unless otherwise indicated, the elements may be implemented as one of, or a combination of, analog circuitry, digital circuitry, or one or more microprocessors executing software instructions. The software instructions may include digital signal processing (DSP) instructions. Operations may be performed by analog circuitry or by a microprocessor executing software that performs the mathematical or logical equivalent to the analog operation. Unless otherwise indicated, signal lines may be implemented as discrete analog or digital signal lines, as a single discrete digital signal line with appropriate signal processing to process separate streams of audio signals, or as elements of a wireless communication system. Some of the processes may be described in block diagrams. The activities that are performed in each block may be performed by one element or by a plurality of elements, and may be separated in time. The elements that perform the activities of a block may be physically separated. Unless otherwise indicated, audio signals or video signals or both may be encoded and transmitted in either digital or analog form; conventional digital-to-analog or analog-to-digital converters may not be shown in the figures.

FIG. 1 shows a class D amplifier 10. $V_{high}$ voltage source 12 is coupled to switching node 14 by switch 16 and to node 18 by diode 20. $V_{low}$ voltage source 22 is coupled to switching node 14 by switch 24 and to node 18 by diode 26. Switching node 14 is coupled to ground through capacitance 40 (which does not necessarily represent a component capacitor and may be parasitic capacitance, for example from field effect transistors [FETs] that perform the function of the switches 16 and 24 and the diodes 20 and 26) and to node 18. Node 18 is coupled to node 28 by inductor 30. Node 28 is coupled to ground by output capacitor 32 and is coupled to output terminal 34. Output terminal 34 is coupled to load 36. Modulator 38 is operatively coupled to switches 16 and 24 to control switches 16 and 24.

The inductor 30 and the capacitor 32 form an output filter. Switching amplifiers generally utilize an output filter to prevent switching frequencies and their harmonics from radiating and causing electromagnetic interference (EMI) with other equipment.

In operation switches 16 and 24 are closed and opened by the modulator 38 in accordance with a switching cycle. Switch 16 is closed connecting the load through inductor 30 to a voltage source ($V_{high}$) 12 higher than the highest required load voltage for an interval, at the end of which switch 16 is opened and switch 24 is closed connecting the load through inductor 30 to a voltage source ($V_{low}$) 22 lower than the lowest required load voltage for another interval, at which point switch 24 opens and switch 16 is closed again. The voltage at the load will average to a value between $V_{low}$ and $V_{high}$ in proportion to the relative "on" time of the two switches. That proportion (the "duty cycle") is varied substantially continuously by the modulator with the goal to produce the desired output voltage. The inductor current (referenced in the outward direction) will change positively when switch 16 is on and change negatively when switch 24 is on and will average to the output current, with the switching cycle variation termed the "ripple current". For the most part, the ripple current will flow through the output capacitor 32, and the average inductor current will equal the current in the load.

It is important that switches 16 and 24 not be closed at the same time, even for an instant, since the two switches would short the two voltage sources together, with wasteful and possibly catastrophic results. On the other hand, since the inductor current cannot change instantaneously, if switch 24 does not close immediately after switch 16 opens, the inductor current must flow through either diode 20 or 26, or through capacitor 40. Assuming the capacitance of capacitor 40 is negligible, at the moment one switch opens and before the other one closes, one or the other of diodes 20 and 26 will conduct, depending on the polarity of the current in the inductor 30. Depending on which diode conducts, the voltage at the switching node 14 will either remain where it is until the other switch turns on, or it will revert to the other supply voltage immediately, in advance of the other switch turning on, a process termed self-commutation.

As a practical matter, in order to ensure that both switches 16 and 24 are never on at the same time, it is necessary deliberately to delay switch turn-on some time after switch turn-off. This delay is referred to as "dead time". The switching node transition may occur either at switch turn-on or at switch turn-off, depending on the direction of the inductor current. When the load current is low, so that the inductor current reverses during the switch "on" time, low-high and high-low transitions will both occur at switch turn-off, and the pulse width from the modulator will be preserved. But if the load current exceeds the ripple current, so that the inductor current does not change polarity during the switching cycle, then one transition will occur at switch turn-off, and the other at switch turn-on, and the pulse width will be modified by the dead time and pulse width distortion occurs. The modified duty cycle will result in the output differing from the desired output by a fixed voltage $$V_{dt}=(V_{high}-V_{low}) \times T_{deadtime}/T_{cycletime}$$

The output voltage error will be $-V_{dt}$, 0, or $+V_{dt}$, depending on the output current and the peak ripple current.

Since the error depends on the output current, and the output current is not in general known from the output voltage, the error cannot be corrected with a simple non-linearity in the forward path. Correction requires access to the current waveform in the output inductor. If the complete current waveform for the inductor is available, the correction circuit can examine it for zero crossings. If the inductor current is traversing positive and negative during the switching cycle, no correction need be applied. If the inductor current remains positive for a whole switching cycle, a correction signal should be injected at the input of the amplifier which will increase the output by Vdt, and conversely, if the inductor current remains negative, a correction signal should be injected which will decrease the output by Vdt.

Figure 2:
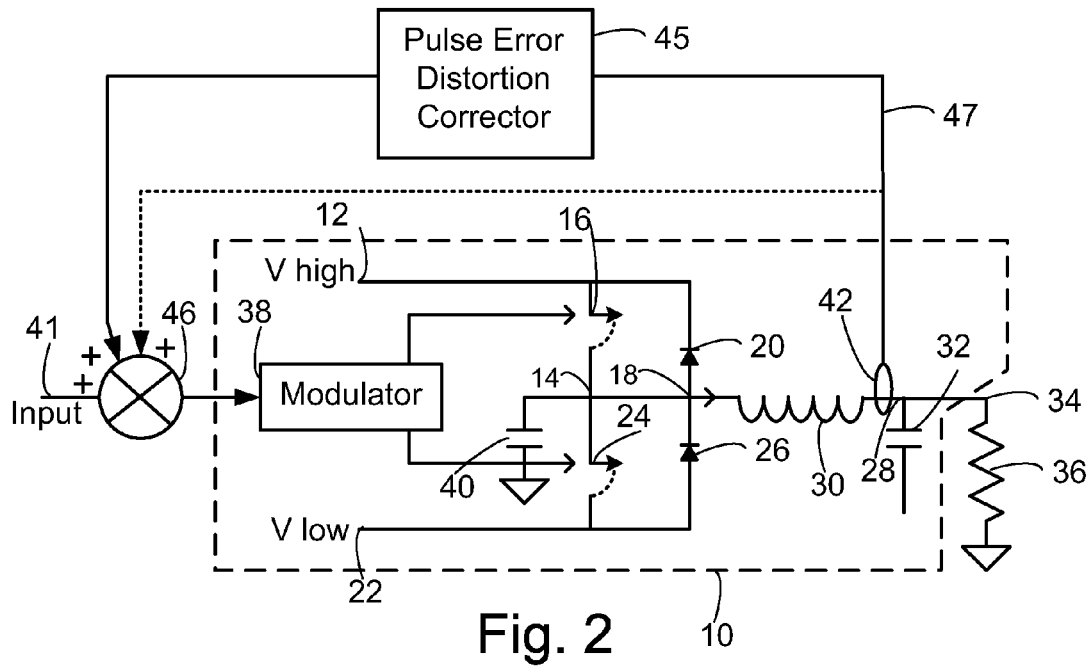

FIG. 2 shows a class D amplifier with circuitry for correcting the output error. FIG. 2 has a pulse error distortion corrector 45, operatively coupling an input summer 46 and a current sensor 42 measuring current at the output inductor 30. In amplifiers having an outer current loop to stabilize the voltage loop, the current sensor 42 may be coupled to the input summer 46 both directly, as indicated by dashed line 47, and through the pulse error distortion corrector 45.

FIG. 3 also shows a class D amplifier with circuitry for correcting the output error. The pulse error distortion connector 45 is in the form of a soft clipper 44 that receives input from the current sensor 40, but also the voltage at node 28.

In operation, the pulse error distortion corrector 45 of FIG. 2 or the soft clipper of FIG. 3 provides to the input summer 46 a signal that corrects for the output voltage error. The correcting signal is summed with the input to the modulator 38. The correcting signal will be discussed in more detail below.

The pulse error distortion corrector 45 of FIG. 2 or the soft clipper 44 of FIG. 3 examines the current in the output inductor 30, or the current in the output inductor 30 and the voltage at node 28, respectively, and applies a correction signal to the modulator which changes the duty cycle command from the modulator to compensate for the switching duty cycle error resulting from the current in the output inductor. If the inductor current waveform is available with sufficient bandwidth to observe directly whether it is passing through zero during the switching cycle, that information can be used to apply the correction. If only a smoothed current representation is available, the correction can still be applied based on whether the average current is more positive than the positive peak ripple current, or more negative than the negative peak ripple current. The peak ripple current is dependent on the output voltage, but it is readily determined using the formula $$I_{peakripple}=K \times (V_{high}-V_{out}) \times (V_{low}+V_{out})$$

where K depends on the inductance, the voltage span ($V_{high}-V_{low}$) and the switching rate. Signals corresponding to plus and minus $I_{peakripple}$ can be readily derived from the output voltage with analog circuitry, compared with the signal corresponding to the smoothed output current, and the appropriate correction applied.

FIG. 4 shows the error in the output voltage (the vertical axis) as a function of the average output current (the horizontal axis) with zero switching node (18 of FIGS. 1 and 2) capacitance. The peak to peak ripple current is represented by the distance 48.

Figure 5:
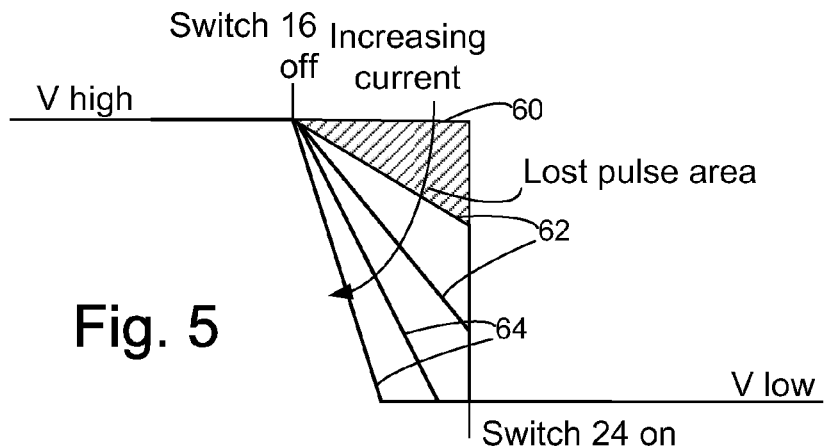
FIG. 5 is a representation of the range of speeds and shapes of the transition, and the resulting error for a high-to-low transition.

In most instances the capacitance at the switching node, represented by capacitor 40 of FIGS. 1-3 will be far from negligible. In that case, when switch 16 opens, the inductor current can also flow through the capacitor 40. If the inductor current polarity is such as to forward-bias diode 20, the voltage still does not change until switch 24 turns on. As long as switch 24 can handle a large current the switching node voltage will change quickly when switch 24 turns on. If, however, the inductor current would reverse-bias diode 20 when switch 16 turns off, the current will flow in capacitor 40. The switching node voltage will slew to the opposite voltage at a rate dependent of the magnitude of the inductor current, and the amount of capacitance presented by capacitor 40. If the switching node voltage reaches Vlow before switch 24 turns on, diode 26 will begin to conduct, holding the switching node voltage at Vlow. But if the switching node voltage has not yet reached Vlow by the time switch 24 turns on, switch 24 turn on will bring the voltage the remainder of the way quickly. The range of speeds and shapes of the transition, and the resulting error, may be shown graphically for a high-to-low transition as shown in FIG. 5.

If the switching node voltage reaches Vlow by the time switch 24 turns on or earlier, full self-commutation occurs. As the output current changes, a typical amplifier operates in all the conditions, no commutation (line 60), partial self-commutation (lines 62), and full self-commutation (lines 64), shown in FIG. 4. The error for a single transition in partial self-commutation is given by $$V_{error}=I_L/C_{sw} \times (T_{deadtime})^2/2 \times T_{period}$$

If full self-commutation occurs, the error is given by $$V_{error}=((V_{high}-V_{low}) \times (T_{deadtime})-((V_{high}-V_{low})^2 \times C_{sw}/I_L))/T_{period}$$

If no self-commutation occurs, the error for that transition is essentially zero.

Pulse area is lost (represented by the hatched area of FIG. 5) on both positive and negative transitions, but the polarity of the resulting error is opposite. The total error in the output is the combination of the error from the positive transition and the error from the negative transition, recognizing that the inductor current at the two transitions differs by the peak to peak ripple current (assuming that the average output current is varying only slowly). The shape of the total error vs. output current is quite different from the no-capacitance condition discussed previously. With capacitance, net pulse area distortion occurs at all average current levels except 0, and the size of the error depends on the size of the current. If the average current is zero, commutation is equally rapid at either transition since the inductor current at switch turn-off has the same magnitude (the peak ripple current) for either transition, so the total error is zero. As the average current becomes positive the negative-going transition becomes faster, while the positive-going transition becomes slower, effectively increasing the low portion of the cycle and reducing the output voltage from its intended value. Likewise, as the current becomes negative, the positive-going transition becomes faster, increasing the output voltage.

Once the average current exceeds the peak ripple current, one transition ceases to self-commutate at all, so its timing is no longer affected by further increases in average current. The other transition continues to self-commutate even faster with increasing current. Eventually this reaches a limit at which the transition is so fast that further speed increases do not significantly affect the area. In this condition the "lost duty cycle" approaches the deadtime and the error, $V_{dt}$, is the same as for the case with negligible switching node capacitance.

Figure 6:
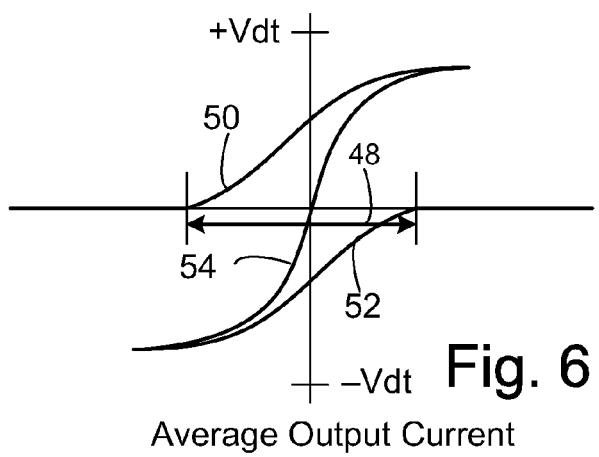

The resulting nonlinearity requires a correction which may be graphically represented as shown in FIG. 6. FIG. 6 is similar to FIG. 4, except in contrast to FIG. 4, in which there was zero capacitance at switching node 14 of FIGS. 1 and 2, there is substantial capacitance. In the curve of FIG. 4, the error from negative-going transition (inverted) is represented by segment 50. The error from positive-going transition is represented by segment 52. The overall correction required is represented by segment 54, and the peak to peak ripple current is represented by two-headed arrow 48.

With switching node capacitance, the total error, and the required correction, varies smoothly with average output current. The error is almost linear for small output current, but is "compressed" between plus and minus $V_{dt}$ for large current. The shape of the required correction does depend somewhat on the amount of ripple current, and thus on the output voltage.

A correction may be applied in accordance with FIG. 5, using the soft clipper 44 of FIG. 3, taking both output current and voltage into account. But an examination of the graph of the variation of required correction with ripple current reveals that, roughly speaking, the correction curve is steepest for a peak ripple current just sufficient to fully self-commutate the switching node during the deadtime at zero voltage output. With somewhat more ripple current, the curve becomes flatter, but more linear, and with less ripple current, it also becomes flatter, though more rounded. If the ripple current for zero voltage output is set to a level about 1.5 times that needed for full self-commutation (which will still give reasonably low idle losses), the required correction becomes quite uniform over a wide range of output voltage, so a reasonable correction, improving distortion by 2:1 to 3:1 or more, can be made without taking output voltage into account at all and the pulse error distortion corrector 45 is sufficient.

Numerous uses of and departures from the specific apparatus and techniques disclosed herein may be made without departing from the inventive concepts. Consequently, the invention is to be construed as embracing each and every novel feature and novel combination of features disclosed herein and limited only by the spirit and scope of the appended claims.

What is claimed is:

1. An amplifier comprising:
an output voltage controlling circuit, comprising:
a switching circuit characterized by a duty cycle and comprising at least two switches; and
a modulator configured to control the switches;
an output inductor, coupling the switching circuit to an output terminal; and
correction circuitry comprising:
a current sensor that senses the current from the output inductor to the output terminal; and
a pulse error distortion corrector configured to receive a sensed current measurement from the current sensor, and, based on the sensed current measurement, provide to the modulator a non-linear correction signal which modifies the duty cycle to compensate for pulse width distortion caused by dead time during which the at least two switches are open.

2. An amplifier according to claim 1, the correction circuitry further comprising a voltage sensor at the output terminal, coupled to the correction circuitry.

3. An amplifier according to claim 2, wherein the sensed voltage modifies the correction signal by modifying the shape of the non-linearity.

4. An amplifier according to claim 1, wherein the correction circuitry comprises a soft clipper to provide the correction signal.

5. A method for operating an amplifier, comprising:
opening and closing a plurality of switches according to a duty cycle to control the voltage provide to an output terminal;
measuring current through an inductor to the output terminal; sensing the current through the inductor to the output terminal to provide a sensed current measurement; and
based on the sensed current measurement, applying a non-linear correction signal which modifies the duty cycle to compensate for pulse width distortion caused by dead time during which the plurality of switches are open.

6. The method of claim 5, wherein the non-linear correction signal is responsive to the voltage at the output terminal.

* * * * *